(12) United States Patent
Gueta

(10) Patent No.: US 10,701,150 B2
(45) Date of Patent: Jun. 30, 2020

(54) METHOD AND APPARATUS FOR STORING NETWORK DATA

(71) Applicant: GLASSBOX LTD., Petach Tikva (IL)

(72) Inventor: Yaron Gueta, Hod Hasharon (IL)

(73) Assignee: GLASSBOX LTD, Petah Tikva (IL)

( * ) Notice: Subject to any disclaimer, the term of this patent is extended or adjusted under 35 U.S.C. 154(b) by 488 days.

(21) Appl. No.: 14/401,979

(22) PCT Filed: May 17, 2013

(86) PCT No.: PCT/IL2013/050422
§ 371 (c)(1),
(2) Date: Nov. 18, 2014

(87) PCT Pub. No.: WO2013/171751
PCT Pub. Date: Nov. 21, 2013

(65) Prior Publication Data
US 2015/0201020 A1    Jul. 16, 2015

Related U.S. Application Data

(60) Provisional application No. 61/648,832, filed on May 18, 2012.

(51) Int. Cl.
*H04L 29/08*    (2006.01)
*H03M 7/30*     (2006.01)
*G06F 16/957*   (2019.01)
*H04L 29/06*    (2006.01)

(52) U.S. Cl.
CPC ...... *H04L 67/1097* (2013.01); *G06F 16/9574* (2019.01); *H03M 7/30* (2013.01); *H03M 7/3079* (2013.01); *H04L 69/04* (2013.01)

(58) Field of Classification Search
USPC .......................................................... 709/232
See application file for complete search history.

(56) References Cited

U.S. PATENT DOCUMENTS

| 7,370,120 B2 | 5/2008 | Kirsch et al. |
| 2002/0101367 A1* | 8/2002 | Geiger ............ H03M 7/30 341/51 |

(Continued)

OTHER PUBLICATIONS

EdgeSuite Turbocharging Websites. Whitepaper. Akamai, 2001. Retrieved from the Internet: http://www.cs.cmu.edu/~15-10/READINGS/optional/Akamai_EdgeSuite_Turbocharging_Websites.pdf.AKAMAI. Dec. 31, 2001. pp. 5-10.

(Continued)

*Primary Examiner* — Umar Cheema
*Assistant Examiner* — Tony Williams
(74) *Attorney, Agent, or Firm* — S. J. Intellectual Property

(57) ABSTRACT

A method of storing data is provided. The method includes receiving a first set of data provided over a network session, and compressing the first set of data to form a second set of data. As further provided, the second set of data includes a number of bytes smaller than the first set of data. Further, the second set of data includes a portion of compressed data that is common to other network sessions. The method further includes compressing further the portion of the compressed data common to other network sessions to obtain a third set of data, and storing the third set of data.

16 Claims, 6 Drawing Sheets

(56) References Cited

U.S. PATENT DOCUMENTS

| | | | |
|---|---|---|---|
| 2003/0110296 A1* | 6/2003 | Kirsch | H04L 29/06 |
| | | | 709/246 |
| 2005/0219076 A1* | 10/2005 | Harris | G06F 16/10 |
| | | | 341/51 |
| 2008/0133536 A1* | 6/2008 | Bjorner | H03M 7/30 |
| 2008/0224903 A1* | 9/2008 | Samuels | H03M 7/3084 |
| | | | 341/51 |
| 2009/0112905 A1* | 4/2009 | Mukerjee | G06F 17/30625 |
| 2010/0306524 A1* | 12/2010 | Runkis | H04L 9/0894 |
| | | | 713/150 |
| 2011/0154461 A1* | 6/2011 | Anderson | H04L 63/0227 |
| | | | 726/7 |
| 2012/0036190 A1 | 2/2012 | Samuels et al. | |
| 2012/0047284 A1* | 2/2012 | Tarkoma | H04L 67/06 |
| | | | 709/247 |

OTHER PUBLICATIONS

International Search Report, International Application No. PCT/IL2013/050422, dated Aug. 29, 2013.
Ricardo Filipe et al.: "Towards full on-line deduplication of the web", Inforum 2010—II Simp'Osio De Inform'Atica, Sep. 9, 2010, pp. 291-302, XP055178795.
Anonymous—"Data deduplication", Wikipedia, the free encyclopedia, Oct. 4, 2011.
Supplementary European Search Report, dated Mar. 15, 2016.

\* cited by examiner

300

400

METHOD AND APPARATUS FOR STORING NETWORK DATA

CROSS-REFERENCE TO RELATED APPLICATIONS

This present application is a National Stage entry of International Application No. PCT/IL2013/050422, filed May 17, 2013, which claims priority to U.S. Provisional Patent Application No. 61/648,832, filed May 18, 2012. The disclosures of the prior applications are incorporated in their entirety by reference.

BACKGROUND OF THE INVENTION

1. Field of the Invention

The present invention relates generally to storage of digital data, and more particularly to compressing data generated over a network.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Compression of digital data has become an indispensable tool in almost every computing platform adapted to store large amounts of data, such as those arising from various modalities and process including, video imaging, sound, data mining, financial data, digital applications, and many other applications producing an ever increasing amount of data. Indeed, a growing computational power of many computing platforms has given rise to some very unique compression algorithms, some of which have become quite prevalent and popular among many users. Various compression techniques and algorithm, such as Huffman algorithms, LZW algorithm and/or Run Length Encoding may each be adapted to address different applications and/or different data structures, such as video, sound, and so forth.

Although such common compression techniques are effective when storing certain data, some of them involve substantial processing, particularly, during a decompression of the data, that is, when the compressed data is retrieved. For example, in Huffman decoding, a processor normally reads the data twice in order to build and/or retrieve a decoding key generally considered an inherent and integral part of the stored data. Hence, such decoding generally can take substantial time and could involve considerable processing overhead and time. This could further burden and/or strain the processing system, as well as lead to increase in costs and resources. Furthermore, certain encoding techniques, such as Huffman encoding, may involve and/or depend on various sensitive and lengthy statistical processes, also requiring substantial processing time, again, leading to similar shortcomings mentioned above.

Still, more significantly, conventional digital data compression/decompression techniques, such as those mentioned above, may not be very well suited for handling data generated by or that is accessible through dynamical networks, particularly, those through which data continually flows and/or is gathered in real time and on-the-fly between users endpoint, servers, processors and the like. Thus, the aforementioned data compression techniques may inherently be too rigid or otherwise not provide enough flexibility for generally accommodating efficient and reliable compression of transient data.

SUMMARY

Certain aspects of embodiments disclosed herein by way of example are summarized below. It should be understood that these aspects are presented merely to provide the reader with a brief summary of certain forms of an invention disclosed and/or claimed herein might take, and that these aspects are not intended to limit the scope of any invention disclosed and/or claimed herein. Indeed, any invention disclosed and/or claimed herein may encompass a variety of aspects that may not be set forth below.

The present disclosure relates to techniques for compressing and storing network data generally made up of and/or conforming to certain protocols, such as hypertext transfer protocol (HTTP). Accordingly, in certain embodiments of the present technique, systems and methods are devised for compressing and decompressing data forming viewable network sessions, such as webpages originating from a multitude of sources. Hence, the present technique provides for a method of storing data, whereby a first set of data is received over a network session. Such data is compressed to form a second set of data, whereby the second set of data includes a portion of compressed data that is common to other network sessions. The method further provides for compressing further the portion of the compressed data common to other network sessions to obtain a third set of compressed data, such that the third set of compressed data is representative of the 4 network session. Finally, the method includes storing, within a storage device, the third set of data.

The present technique further provides for a method of decompressing data. The method includes retrieving from a storage device a set of compressed data, such that the compressed data is representative of a network session. The method further includes decompressing the set of data to obtain a first portion of compressed data and another first portion of data, such that the first portion of compressed data includes data that is common to other network sessions. The method also includes decompressing further the first portion of compressed data common to the other network sessions to obtain a second portion of data. Finally, the method includes combining the first and second portions of data to obtain data comprising the network session, such that the network session data includes a number of bytes larger than the first portion of compressed data and the first portion of data.

More specifically, certain embodiments of the present technique provide for systems and methods adapted for storing viewable webpages. In so doing, such webpages may be broken down to digital documents, whereby each document may be partitioned into multiple segments such as lines. Upon such line partitioning of the document, the present technique utilizes certain transformations for map each of the lines onto an index, adapted to abbreviate content included in each of the aforementioned lines. Such mapping may constitute any transformation of choice, such as a hash function or other desirable and/or convenient mappings of choice. Such mappings, as utilized by the present technique, generally form a key that is independent from the data, e.g., HTTP components or resources, upon which the key acts. This provides a robust tool for significantly reducing the number of bytes forming each webpage and, thereby, achieving a relatively high compression ratio, as well as a tool for efficiently retrieving such documents in a timely manner once such documents are compressed and stored.

This also enables the storage of the data, i.e., webpages, as users access the webpage and/or throughout the networks sessions users conduct in accessing the various webpages.

Further aspects of the present technique may take advantage of certain static and/or dynamical attributes shared by many viewable webpages for further enhancing compression and storage of the above mentioned HTTP documents. Hence, because many of the webpages may include recurring data, that is data that is shared by numerous webpages accessible to various clients, and/or addressing the webpages across long periods of time would result in identical data, the present technique utilizes the above document partitioning and mappings to encode and/or decode such voluminous redundancies to provide a very efficient and reliable compression and/or decompression scheme. Accordingly, such methods may save considerable storage space and further provide a very efficient and quick retrieval of the compressed data.

In utilizing the above document partitioning, mappings and/or indexes, the present technique is further adapted to recognize particular recurring data patterns for classifying particular pages or segments thereof as part of the compression or decompression process. Hence, by virtue of their recurring patterns such particular resources can be saved less frequently while further utilizing the disclosed indexing and mapping scheme to further compress other pages having similar patterns. Thus, when compressing and/or decompressing webpages having patterns indicative of recurring data shared by many other webpages, the already and less frequently saved pages can be called upon to represent those resources or, portions thereof, having similar patterns. In so doing, considerable processing time can be saved, as the many recurring pages or, portions thereof may not require further compression and/or decompression processing.

Furthermore, the present technique also utilizes statistical methods for recognizing and learning recurring data patterns, as may happen when statistical changes in newly acquired data may give rise to new statistical patterns, to which the disclosed system can adapt in recognizing and/or reclassifying recurring webpages having shared features and attributes.

Hence, techniques disclosed herein, for example, could be very well suited for those entities utilizing systems that monitor, record or otherwise document web activity, such as, entire web sessions and/or other web related transactions. Hence, in such settings the present technique can efficiently compress, decompress, and/or store the numerous data resulting from ongoing and persistent web activity.

Various refinements of the features noted above may exist in relation to various aspects of the present invention. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present invention without limitation to the claimed subject matter.

BRIEF DESCRIPTION OF THE DRAWINGS

These and other features, aspects, and advantages of the present invention will become better understood when the following detailed description of certain exemplary embodiments is read with reference to the accompanying drawings in which like characters represent like parts throughout the drawings, wherein.

DETAILED DESCRIPTION OF SPECIFIC EMBODIMENTS

One or more specific embodiments of the present invention will be described below. These described embodiments are only exemplary of the present invention. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
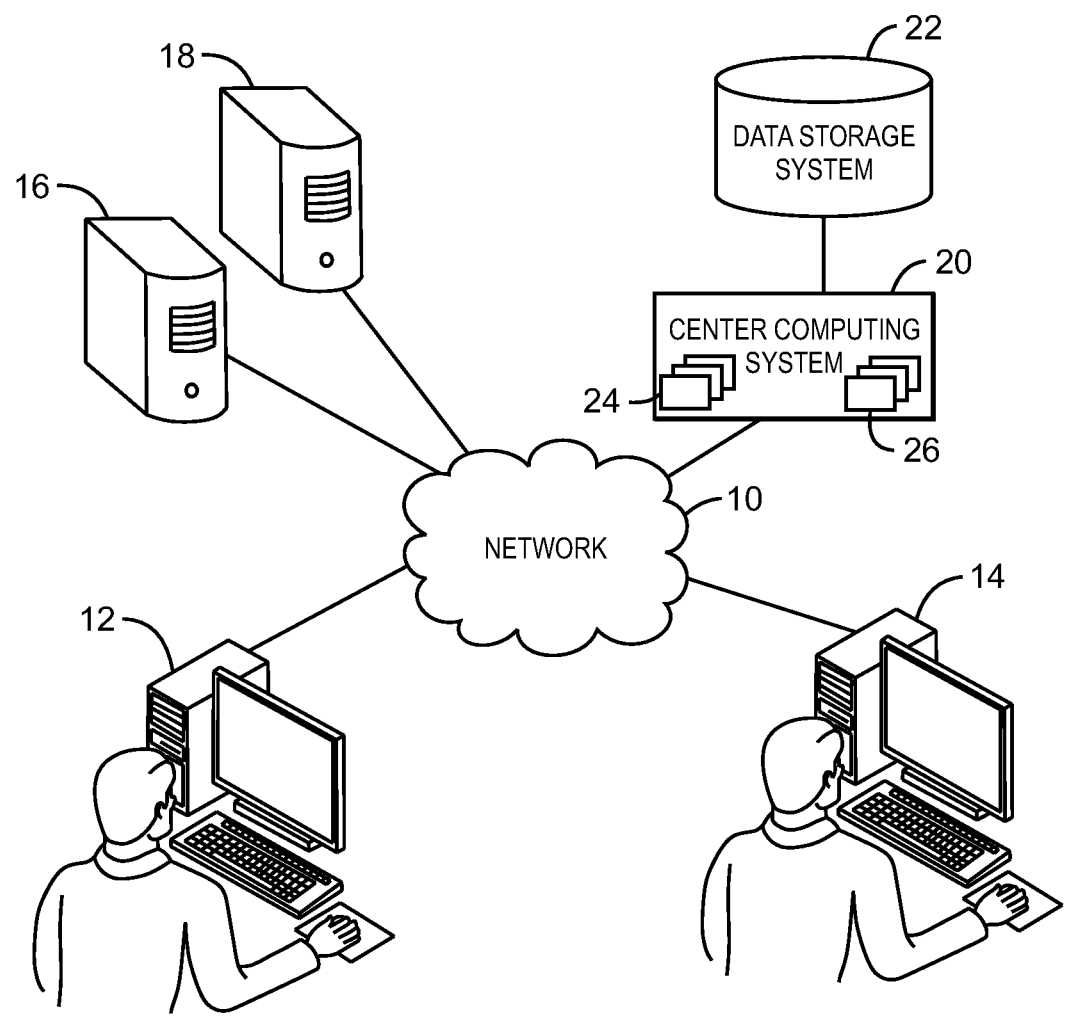
FIG. 1 is illustrates a network in accordance with one embodiment of the present technique.

Referring now to the figures, particularly, FIG. 1 is a network diagram 10, in accordance with an exemplary embodiment of the present technique. Accordingly, the figure depicts a communications network 10 adapted for connecting various nodes and/or end users and for facilitating the transfer data between various computer systems, such as servers, the nodes, end users and so forth. As described further below, such computer devices may be involved in the transfer of information, generally forming digital data originating from various computing processes provided over the network as downloadable and viable information accessible to various users and/or institutions. Such information, as provided over the network 10, may be monitored, collected, documented and/or stored, periodically and/or at random, in accordance with certain needs or criteria. While such monitoring and/or collection of data over the network 10 may be a routine undertaking, it may, nevertheless, result in compilations of significantly large amounts of storable and retrievable data. In accordance with the present technique, the network 10 is adapted to apply a dynamical compression technique, whereby storage of such voluminous data is achieved by compressing the network data real time and on-the-fly resulting from users accessing the network when conducting various transactions involving accessing network resources, such as retrievable and/or viewable webpages.

In so doing, the network data or portions thereof can be segmented and mapped utilizing one or more functions and/or key(s) (e.g., hash functions) whose makeup and attributes are generally independent from the actual network data eventually stored. Hence, some aspects of the present technique, as further described below, provides an efficient and expeditious data retrieval process conducted over the network 10, while eliminating any data dependant key(s) and or key retrieval steps decoding steps that could otherwise delay or corrupt the encoding and/or decoding of the aforementioned network data.

Further, the network 10 may be an Internet network, an Intranet, or other types of local, wide and/or global area communications network. Hence, the network 10 may include a wire line network, wireless network, satellite network, or a combination thereof. As illustrated by FIG. 1, the computing systems, servers, nodes/endpoints/end users, connected and forming the network 10 include the user endpoints 12 and 14, as well as, servers 16, and 18. The network 10 also includes central computing system (CCS) 20, further coupled to data storage system (DSS) 22, including a tangible, non-transitory, readable medium adapted for storing code and/or other data. As further illustrated, the CCS 20 includes processing devices 24 and 26 adapted to process, encode, decode, compress, and/or decompress digital data, as well as configure such data for use of various applications, some of which may conform to certain protocols, and/or standards, e.g., HTTP, and/or other well known and familiar standards used and implemented over the network 10.

Further, users 12 and/or 14 may be client computers such as a home or office personal computer (PC), a remote client, a thin client, mobile device, or other type of computer and/or processing interface adapted for general data processing and for connecting to the network 10. Although not entirely illustrated by FIG. 1, the client computers 12 and 14 may further be coupled and/or connected to other peripheral devices, such as monitors, keyboards, mice, printers, routers, wireless devices, microphones, speakers, cameras, finger print identifiers, external memory devices, and other devices. The PC 12 may include software platforms and operating systems, such Windows, Linux-Red Hat, and other supporting programs.

Further, the servers 16 and 18 may be adapted for storing, routing and/or communicating data within the network 10 and/or other networks to which those servers may be connected. Such servers may be of the type available by Sun Microsystems, Hewlett Packard, Dell, International Business Machines (IBM), and/or other known server vendors and providers. Accordingly, the servers 16 and 18 may include various hardware devices, such as microprocessors, memory cards, graphic cards, routers, wireless devices and other modules for receiving, transmitting and/or processing data. In addition, the servers may include various software platforms and packages, such as those providing code written in C, C++, Java, Python, Ruby on Rails, and/or other computer languages, for facilitating the everyday operation and use of the servers 16 and 18 as part of the network 10. It should further be borne in mind that the user nodes 12 and 14, as well as the servers 16 and 18 are exemplary, and that the network 10 may include many other additional user nodes similar to the users 12 and 14, as well as, multiple other servers and central computing systems coupled to storage devices similar to the illustrated servers 16, 18, CCS 20 and DSS 22, respectively.

Further, the CCS 20 may be part of any general computing facility, such as those available to individual users, companies and corporations, incorporating computing clouds adapted to retrieve and store (via processing devices 24, 26 and DSS 22) large amounts of data at any given time. Accordingly, the CCS 20 may be adapted to process, analyze, monitor and/or record data, such as web pages, generally available to and accessible by the user 12 and/or 14, via the network 10 upon request. While the CCS 20 and the DSS 22 can process and store server-residing webpage data (as stored on servers 16 and 18), respectively, such data may originate from other network sources including but not limited to private companies and/or corporations, as well as government and/or other pubic organizations. Hence, servers 16 and 18 provide users 12 and 14 access so that those, for example, are able to conduct business and/or manage various tasks through the network 10. For instance, the user 12 may access the server 16 for downloading a webpage belonging to a vendor through which the user 12 may perform financial transactions, such as buying stocks, bonds, options and/or other financial instruments. By further example, the user 12 may access the server 18 for downloading webpages associated with a medical institution and/or an insurance company for providing personal medical, insurance or other information related to the user 12 or other individuals. Still, by further example, the user 12 may download, via the server 18, a government webpage through which the user 12 can provide personal and/or other type of information for conducting everyday personal and/or work-related business and so forth. Accordingly, the user 12/14 may generally form communication sessions during which user 12/14, as well as servers 16 and 18 exchange an enormous amount of information, all of which may be monitored, processed and/or stored by the CCS 20 and DSS 22 respectively.

Figure 2:
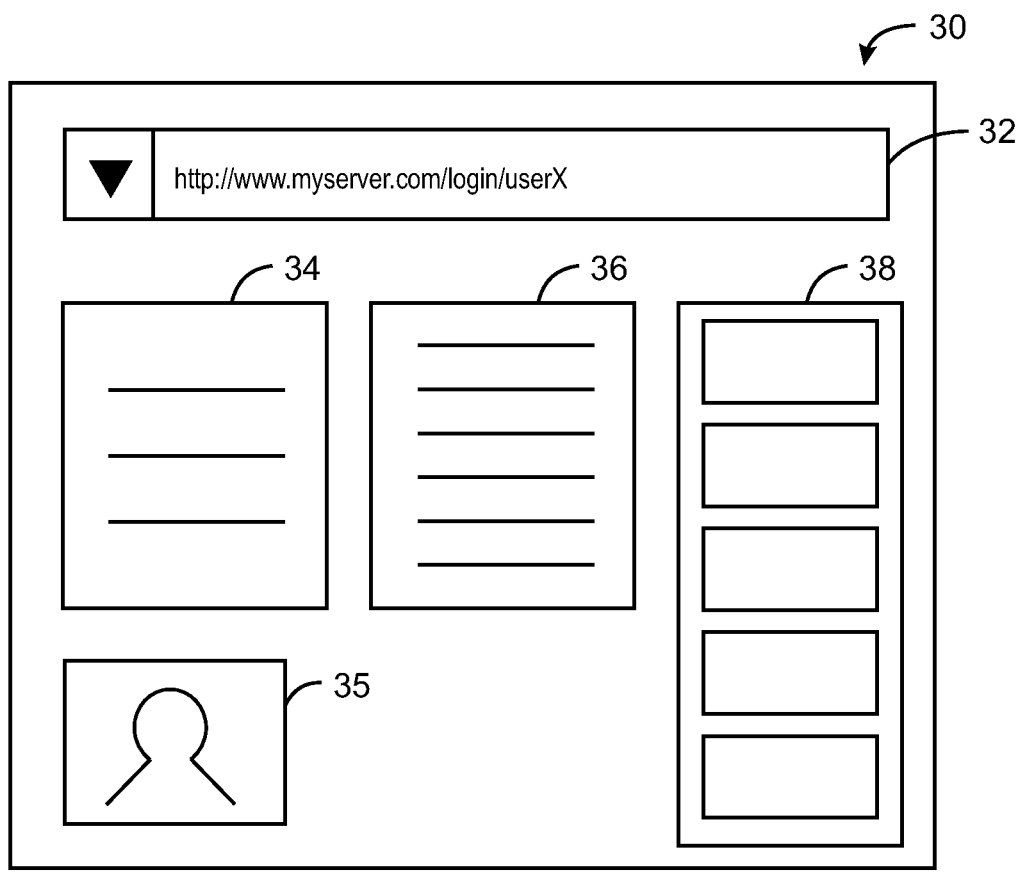
FIG. 2 is a simplified diagram of a webpage in accordance with one embodiment of the present technique.
Figure 3:
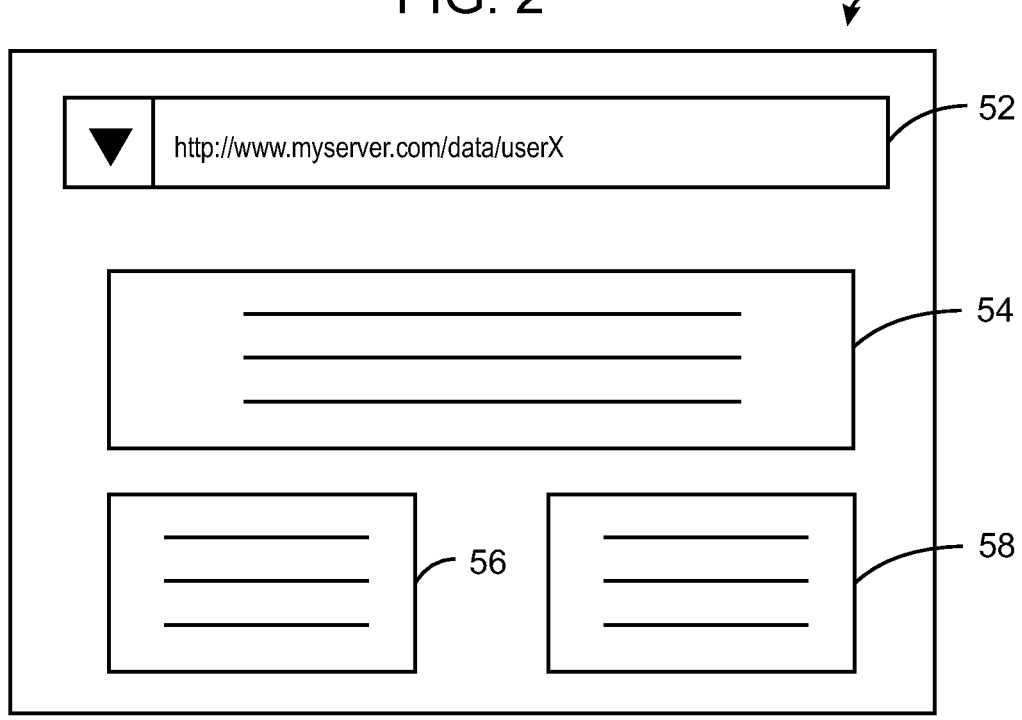
FIG. 3 is a simplified diagram of another webpage in accordance with an embodiment of the present technique.

FIGS. 2 and 3 illustrate simplified views of webpages, in accordance with exemplary embodiments of the present technique. The illustrated webpages may be of the type generally accessible and viewable by the users 12 and 14 over the network 10. Those skilled in the art will appreciate that the illustrated webpages may be provided over a medium, such as the Internet, thereby encoded and/or transmitted to the user in accordance with certain protocols and/or industry standards, such as hypertext markup language (HTML), hypertext transfer protocol (HTTP), and so forth.

Particularly, FIG. 2 illustrates a webpage 30, such as one requested by the user 12 for viewing particular information, as provide by the server 16. In an exemplary embodiment, the webpage 30 may provide the user with personal financial and/or other information, as well as provide the user 12 with a platform for executing particular transactions. For example, webpage 30 could form a login page of a stock trading website, thereby providing the user with a trading platform for trading stocks, options and/or other financial instruments. In so doing, user 12 may use webpage 30 to enter personal and/or other information, as well as be provided with data pertaining to general and particular transactions the user performs through the website 30. Thus, by accessing the webpage 30, the user 12 may initiate a network session, lasting a certain period of time, as conducted over the network 10.

Similarly, FIG. 3 illustrates webpage 50 available for viewing, as the user 12 advances throughout a network session initiated with the website 30. Accordingly, webpage 50 may include more specific and relevant data the user 12 may wish to view, change, or otherwise manipulate in regard to specific transactions the user performs over the website 50. For example, website 50 may provide the user 12 with specific stock data, such as selling and/or buying prices of particular stocks, as well as offer the user 12 features for analyzing and providing projection on various stocks and/or other derivatives of previously acquired stocks.

With reference again to FIG. 2, web page 30 includes general fields 32, 34, 35 and 36, and 38. For example, the field 32, included as part of the page 32, may form a navigable uniform resource locator (URL) address bar, e.g., http://www.myserver.com/login/userX," indicating a login webpage address available for viewing as it may appear to a particular user, i.e., user X (where X may stand for any particular user A, B . . . Z) accessing the webpage 30. It should be borne in mind that each resource is identified by a URL, regardless of whether the resource has been rendered as a document in a browser. Hence, the address bar 32 is merely an illustration, for example, to the viewer of how such resources would be identified. By further example, the field 34/35 may include certain login prompts, such username, pictures, password, and/or other information identifying the user (e.g., user 12) before the specific website, so that the user may gain permission to enter the website and conduct a session, as desired by the user.

Furthermore, the site 30 may contain fields 36 and 38 forming generic fields and providing information not necessarily associated with the particular user accessing the website 30. For example, the fields 36 and 38 may include general instructions of how to use website 30, or the fields 36 and 38 may include promotional and/or advertising information promoted by certain vendors and/or other entities wishing to promulgate information across website 30. In some embodiments, the fields 36 and 38 may include information about the vendor's operations and general activities in a given field of specialty and/or business. Further, the fields 36 and 38 may include company logos, images, and/or other generic graphical illustrations.

To the extent the webpage 30 may include information specific to a user X, i.e., user A or user B (generally also referring to users 12 or user 14), field 34/35 may be one of the sectors encoded with information specific to the user X, i.e., A or B. In other words, certain information, as provided by fields 36 and 38, included within webpage 30 may be similarly or event identically encoded during any login by any user, i.e., users A or user B, into the website 30. Hence, during such user login, the only difference by which the site 30 may be encoded differently would manifest through the webpage filed 34/35, including information specific to the user logging onto the page 30. Thus, in the illustrated exemplary embodiment, the extent to which the website 30 may vary between various users accessing the site, may involve field 34/35, while the fields 36 and 38 may remain unchanged both in content and form between the various users accessing the site 30.

Similarly, as illustrated by FIG. 3, webpage 50 may include information fields 52, 54, 56, and 58, pertaining to the session user 12/14 may conduct while accessing a particular site. Hence, in the illustrated exemplary embodiment, the user advances to webpage 50 after entering login information, as prompted by the above login page 30. In so doing, user 12/14 may conduct an ongoing session with a particular site of a particular vendor or any private or commercial entity. In the illustrated embodiment, field 52 may indicate a navigable URL http://www.myserver.com/data1userX, indicating that the page 50 is, in part, adapted to provide a specific user X, i.e., user A, B . . . Z, (e.g., users 12/14 of FIG. 1) with certain data pertaining to the particular transactions performed by the user in accessing the webpage 50. For example, field 54 may include a table specifying various stock transactions performed by the user or, alternatively, the field 54 may include certain gains and/or losses incurred by user X in trading stocks, bonds, and/or o the financial instruments. Still, by further example, the field 54 may include user specific data analysis performed over time as it relates to the specific financial instruments the user acquired in past transactions or transactions the user has interest in acquiring at a future point in time.

Further, similar 36 and 38 of page 30, fields 56 and 58 of page 50 may be included as part of the page 50 to provide general information, not necessarily specific to user X accessing the page 50. Stated otherwise, the fields 56 and 58 would generally be identical over periods of time where multiple user can access pages similar to the page 50 associated with user A or B, respectively, as those users conduct business over the page 50. Accordingly, while the field 54 may be encoded with user-specific information, the fields 56 and 58 may be encoded similarly in webpages accessible to multiple users accessing the page 50. Thus, information included within the fields 56 and 58 may remain static over prolonged periods of time while that included within field 54 may dynamically change in accordance with user-specific transactions, as described above.

It should be borne in mind that webpages 30 and 50 and information described therein, are exemplary and that the below described technique may generally be applied to a variety of settings in which network data, i.e., webpages, provides multiple users with a variety of information, some of which may be encoded with specific details associated with a user and/or other criteria, while some may be encoded with user independent-information. Such user-independent information may be identically provided to all users having access to the above described webpages.

Accordingly, in certain instances, such web sessions, as conducted by multiple users over webpages 30 and 50, may generate voluminous data, most of which may be monitored and/or documented by various computer systems, such as the CCS 20 and it associated storage device DSS 22. Furthermore, because the above webpages, accessible by the users 12 and/or 14 include repetitive information, the CCS 20 and DSS 22 take advantage of such network data redundancies for effectively encoding/decoding and compressing/decompressing such network data so that it can be stored and easily retrieved at a later time by similar methods.

Figure 4:
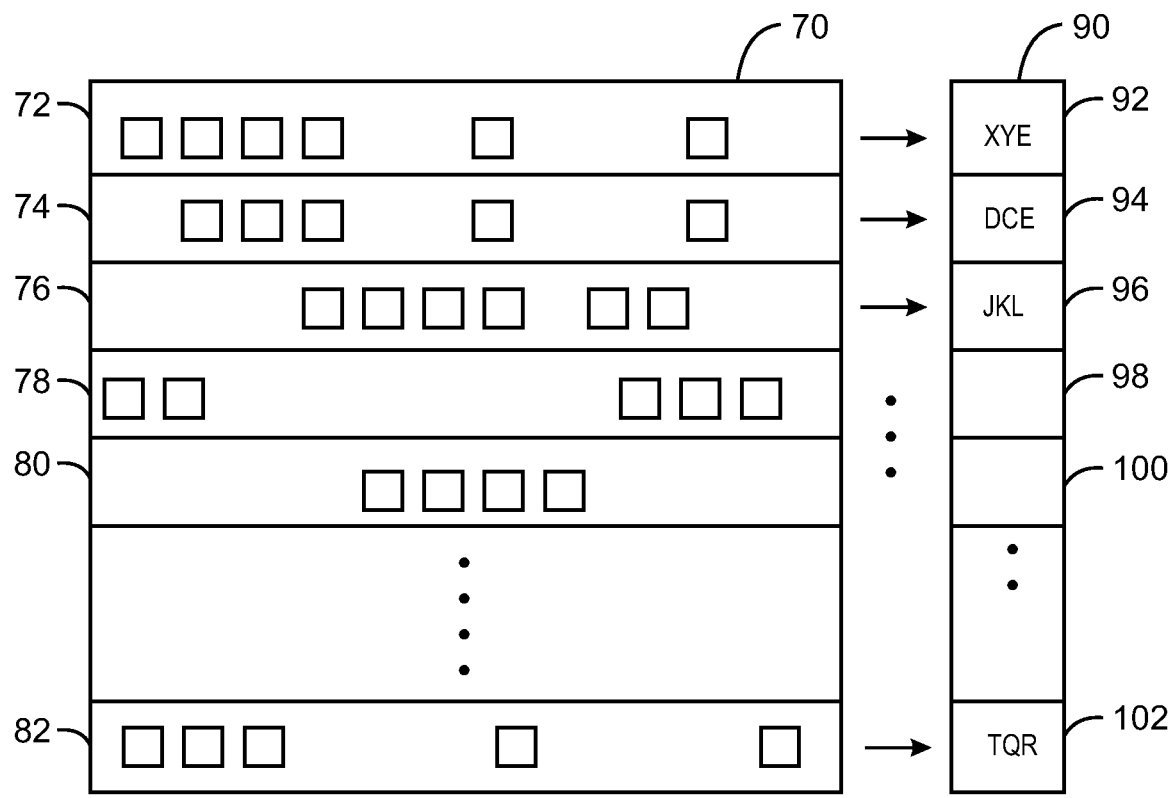
FIG. 4 illustrates a simplified diagram of an encoded representation of one of the webpages illustrated in FIGS. 2 and 3, in accordance with one embodiment of the present invention.

Hence, FIG. 4 illustrates a simplified diagram of an encoded representation of a network document, i.e., webpage, in accordance with an embodiment of the present technique. Specifically, an encoded page 70 may illustrated a manner by which webpages 30 and/or 50 may be encoded though any available encoding schemes such as HTML and/or other languages used for encoding similar or other network data. In accordance with the present technique, the page 70 is formed of multiple lines 72, 74, 76, 78, 80 and 82, whereby each of the aforementioned lines is made up of varying elements. Accordingly, the elements making each of the lines 72-82 may vary in number and/or length, as may be dependent from the actual content making up the page 70, or portions thereof. Those skilled in the art will appreciate that the elements making up each of the lines 72-82 may form alphanumeric characters or other types of characters used in codifying the lines 72-82 of page 70. Further, while the number of lines in each webpage representation, i.e., page 70, may vary in accordance with varying criteria, in a preferred embodiment, each webpage processed by the CCS 20 is partitioned into constant line segments. For example, in one embodiment, the page 70 may be portioned into 1000 lines (e.g., lines 72-82), while in other embodiments the page 70 may be portioned into a greater or less line segments, as may be desired or required by the choice or criteria at hand.

Further, the elements forming each of the lines 72-82 form code words, strings, routines and/or other executable portions of file(s) adapted to be read with and/or compiled by various processing systems for ultimately generating webpages, such the webpages 30 and 50, accessible to the users 12 and 14 over the network 10. Accordingly, because each of the webpages 30 and/or 50 may in some parts include information that is repetitive and/or is common to all users (while in other parts may include information that is specific to the user accessing the page 70), certain portions or lines included within encoded pages, i.e., page 70, may be encoded identically, while other lines may have different encoding contents depending on the user accessing the pages 30 and/or 50.

For example, for users A and B having a login pages 30 with the URLs www.myserver.com/login/userA, and www.mserver.com/login/userB, respectively (see FIG. 2), may give rise to page 70 with lines 72-76 and 82 being encoded identically for both users accessing the webpage 30. In other words, to the extent the webpage 30 is encoded between different users, lines 72-76 and 82 of page 70 may not change for the different users. Thus, encoded lines 72-76 and 82 may be associated with fields 36 and 38 of page 30. By contrast, lines 78 and 80 may encode information specific to the user accessing the webpages such that those lines 78 and 80 are made up of code that is different between the users A and B accessing the webpages 30 and/or 50. In other words, the lines 78 and 80 are associated with fields 34/35, where information is bound to vary in accordance with specific information with which a particular user or web session is associated.

Similarly, and by further example, for users A and B having a user data pages 50 with the URLs http://myserver.com/data/userA, and http://www.myserver.com/data/userB", respectively (see FIG. 3), may result in an encoded page, such as page 70, having some lines, or portions thereof, identically encoded for both users, as well as lines that may be encoded differently between the two users or any other users accessing the page 50.

In further aspects of the present technique, each of the lines 72-82 is further encoded utilizing a mapping adapted to compress or decompress each of the aforementioned lines. Such a mapping may include any general function adapted to map a large set of data into a smaller set of data. Such mapping may include various hash functions, such as MD5 hash function providing a 16 byte hash value for each of the lines 72-82. Other exemplary embodiments of the present technique other mapping may be used, such as hash functions providing 4, 8, and/or any other byte hash value for any of the lines of 72-82. In other embodiments, other cryptographic or hash functions, hash tables, lookup tables and/or arrays may be used. It should be borne in mind that such mapping keys used for compressing and/or decompressing each of the lines 72-82 are independent from the content provided by the aforementioned encoded lines. In other words, the keys, as implemented by the above mapping, may generally be independent from the data the mapping is used to compresses and/or decompress. In so doing, the present technique provides a robust compression/decompression tool whereby the lines 72-82 can be compressed/decompressed using an external key, requiring minimal processing and overhead. Furthermore, upon retrieval of the network data formed of the page 70, such hash function mapping provide a convenient and relatively easy mechanism for decompressing webpage data while eliminating any data scanning and/or key extraction steps otherwise needed for decoding compressed data.

Accordingly, using the aforementioned mappings for compressing/decompressing each of the lines 72-82, there is created an index 90, representing a key for each of the lines 72-82. Thus, lines 90, 92, 94, 96, 98, 100, and 102, provide a reduced number of bytes, i.e., 16, compressing each of the lines 82-92 respectively. Hence, the index 90 may form a concise and complete representation of data included within the page 70, i.e., data representing the original webpages 30 and 50. By the same token, the index 90 may also be used as an inverse mapping for ultimately decompressing the data contained therein for retrieving the original data, as provided by page 70.

As further illustrated, because lines of page 70 may have encoding that is repetitive or is otherwise redundant, as illustrated above for each of the pages 30 and 50 having identical fields between users, corresponding lines 92-102 of index 90 will also give rise to mappings identical between mapping of pages accessible to different users. For example, the fact that lines 72-76 and 82 may have identical encoding content (see above FIG. 4), will naturally give rise to lines 92-96 and 102 as having identical compression content existing between users accessing similar but, not identical, webpages. In other words, utilizing the present technique, certain portions of the webpages 30 and 50, as encoded via an encoding page (e.g., page 70 FIG. 4), may be identically compressed as provided by lines 72-76 and 82 of index 90. By the same token, because lines 78 and 80 of page 70 are encoded with user specific information, so then will index lines 98 and 100 be specifically encoded to conform to a particular user or web session. In other words, index key 90 may be formed of portions, i.e. key lines 98 and 100, varying in compression content between users accessing the webpages 30 and 50, while the key portions represented by lines 92-96 and 102 will remain the same for all users accessing the aforementioned webpages. As will be discussed further below, such partitioning of the index 90 into portions that vary when provided over network 10 and portions remaining constant and recurring, may provide a general tool for further compressing large blocks of recurring data provided over the network 10, thereby achieving greater compression rates of network data.

Figure 5:
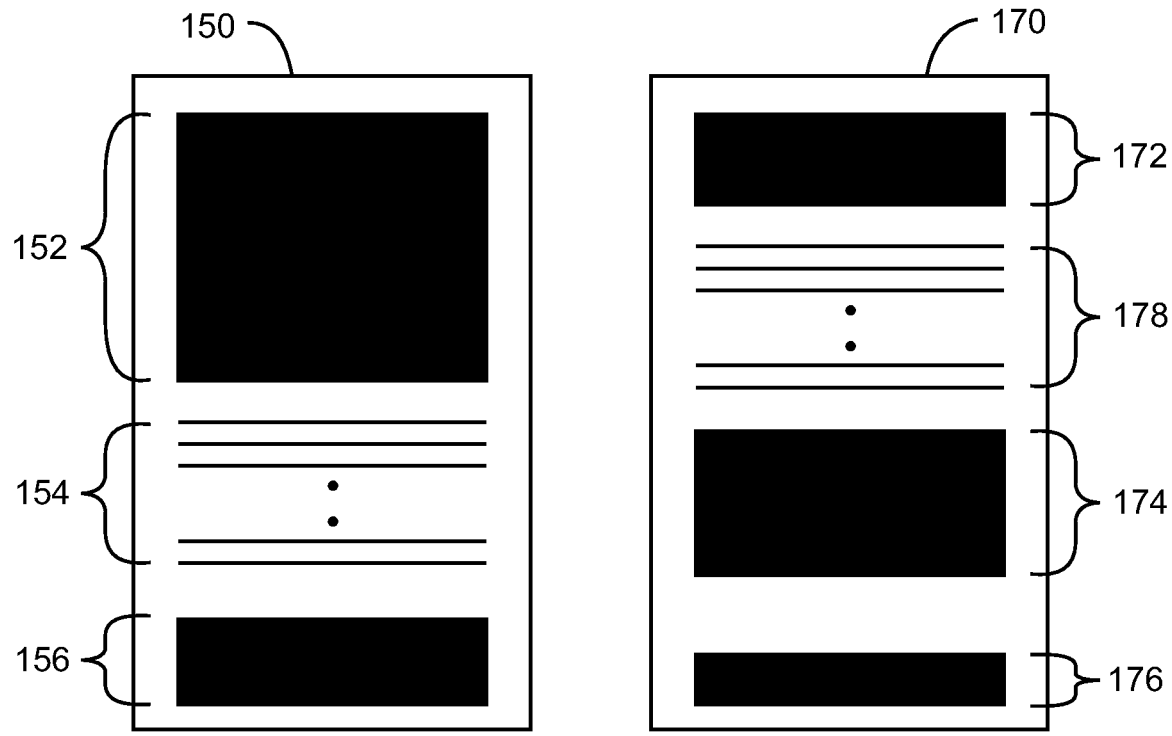
FIG. 5 is a simplified diagram index representations of the webpages illustrated by FIGS. 2 and 3, in accordance with an embodiment of the present technique.

Referring now to FIG. 5, there is provided a simplified diagram of abbreviated index representations of the webpages illustrated by FIGS. 2 and 3, in accordance with an embodiment of the present technique. Accordingly, index representation illustrated by FIG. 5 may be derived from encoded pages, such as page 70, as provided by index 90 of FIG. 4. In the illustrated exemplary embodiment, representation 150 includes an index key representing data originating from webpage 30, discussed above with reference to FIG. 3. The representation 150 includes index blocks 152, 154, and 156, where each of the blocks represents compressed data achieved by the mapping used to obtain index 90 and its compressed lines 92-102. For example, block 152 may form an abbreviated representation of lines 92-96, lines 154 may form an abbreviated representation of lines 98 and 100, and block 156 forms and abbreviated representation of line 102 of index 90.

Hence, blocks 152 and 156 of the abbreviated index representation 150 may from compressed data blocks that are statistically identical between all users accessing the logging webpage 30. In other words, when the CCS 20 (FIG. 1) documents network sessions performed by users 12 and/or 14, the CCS 20 is adapted to recognize that between all the login pages (e.g., page 30) accessed by the various users, block 152 and 156 remain static in form, length and substance regardless of the users accessing the webpage. Thus, compressed index block 152 and 156 provide the CCS 20 a tool for statistically recognizing that such recurring blocks are associated with the webpage 30. In fact, the more users access the login page 30, the better the CCS 20 can gain greater confidence in learning to associate such compressed index blocks with the login page 30. Those skilled in the art will appreciate that various statistical and probabilistic techniques, such as Binomial, Gaussian and other distributions, as well as, Bayesian probability methods and/or other pattern recognition algorithms can be used to recognize certain recurring patterns appearing in abbreviated index representations, such as the representation 150.

As further illustrated by abbreviated index representation 150, the abbreviated lines 154 represent compressed portions of those fields of the webpage 30, i.e., field 34/35, prone to change when various users access the webpage 30, as may happen when users enter user names and/or other personal data specifically associating the user with the webpage 30. Thus, abbreviated index representation 150 provides clear demarcations of those portions of the compressed lines 90 forming data that is recurring between various sessions conducted over the network and those compressed portions of the index 90 adapted to vary between the various conducted network sessions.

Further, if for some reason changes occur within the webpage 30, as may happen when certain data in the webpage is updated, added, removed is somehow altered to some degree, thereby causing the structure of the abbreviated index 150 and/or its content blocks 152 and 156 to statistically change in some manner, the CCS 20 may then adapt its learning process to associate the newly formed patterns. Thus, for example, abbreviated index representation 170 having blocks 172, 174 and 176 may represent newly formed compressed index lines, such as those provided by the index 90, of the webpage 30 whose contents may have changed over time to arrive at the new structure provided by the abbreviated index 170. It should be born in mind that in order for the CCS 20 to recognize and/or reclassify the abbreviated index 170 with the newly formed webpage 30, significant statistical changes must first take place, indicating that a substantial amount of sessions have been conducted to give rise to the index 170, representing a newly formed webpage 30. Although not shown, it should be further borne in mind that other webpages, such as the webpage 50, give rise to certain indexes, as well as abbreviated indexes (e.g., index 90 and abbreviated indexes), having general structures that may also recur throughout different user sections, as described above. In addition, the webpage 50 may also form index lines unique and associated with a particular web session.

Figure 6:
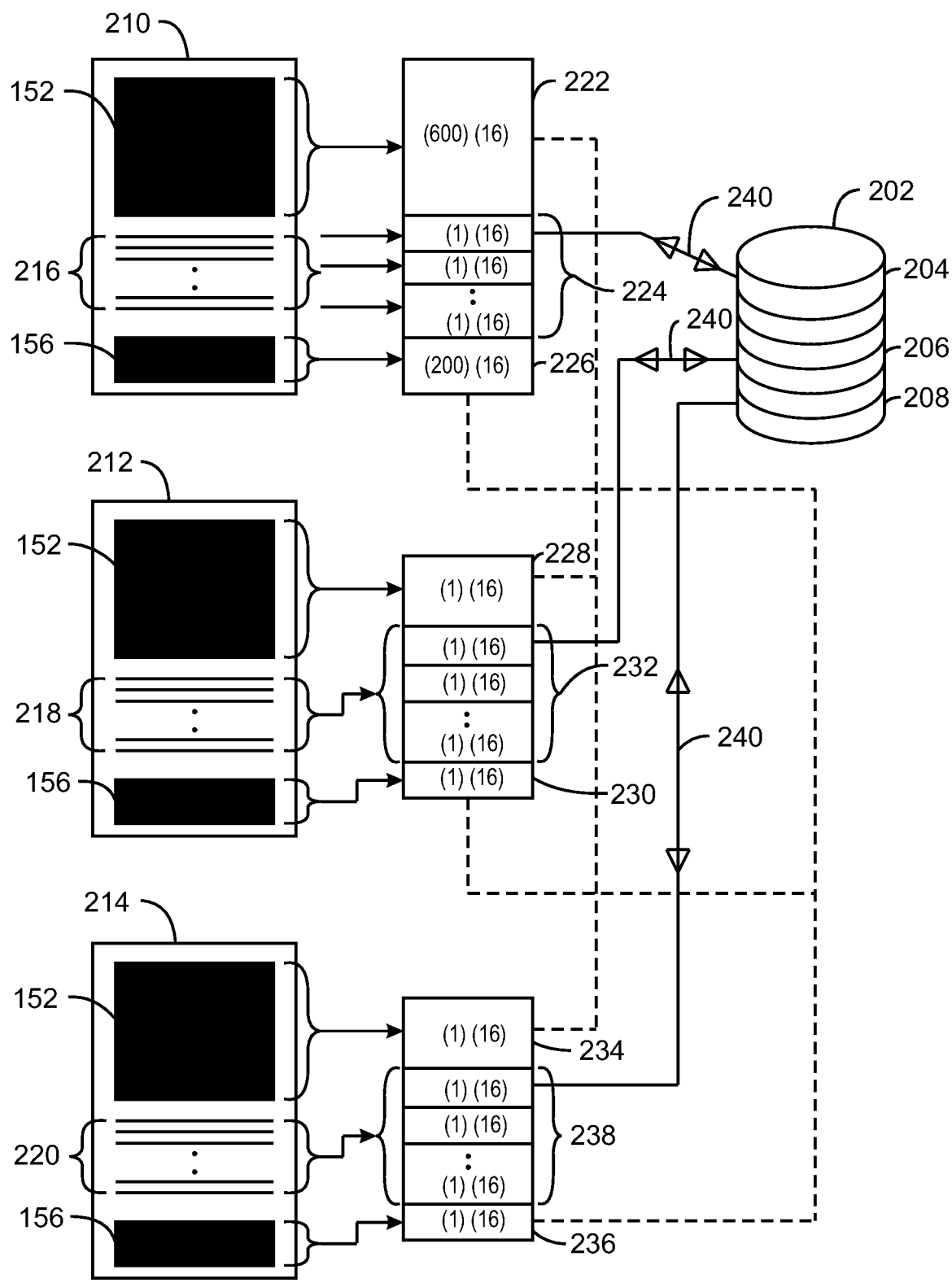
FIG. 6 is a simplified diagram of a data storage system in accordance with an embodiment of the present technique.

FIG. 6 is a simplified diagram of a data storage system 200 in accordance with an embodiment of the present technique. The data storage system 200 includes a data storage device 202 partitioned into multiple data storage bins 202, 206 and 208, where each data storage bin is adapted to store digital data of certain size. Accordingly, the data storage system may be formed of a magnetic storage device, an optical storage device, flash memory, solid state and/or other storage devices, or any combination thereof. In accordance with the present technique, the storage device 200 and its bins 202-208 are adapted to store compressed data as, as well as provide such compressed data when the data is retrieved, as desired.

Accordingly, FIG. 6 further illustrates the manner by which abbreviated indexes, such as the indexes 150 and 170 are stored and, more particularly, the manner by which web session data is compressed, so as to reduce an overall number of bits stored in the storage system 202. As further illustrated, abbreviated index 210, 212, and 214 may represent compressed web session data, for example resulting from web sessions conducted by different users, respectively, when those users access, for example, the login page 30, described above with reference to FIG. 2. The abbreviated indexes 210-214 are obtainable by utilizing a mapping, such as a hash function for compressing lines of webpage data, as described above by FIG. 4. Thus, the abbreviated indexes 210-214 are similar to the index 150 (see FIG. 5) to the extent each of the indexes 210-214 include recurring compressed index patterns 152 and 156, respectively. Still, because each of the indexes 210-212 may originate from different web sessions, whereby each of the sessions is associated with different users, each of the indexes 210-214 also include compressed portions/lines unique, i.e., lines unique to that user session, not shared by any other index or portion thereof. Thus, for example, abbreviated index 210 may include unique lines 216, index 212 includes unique lines 218 and index 214 includes unique lines 220.

The storage device may store each of the indexes 210-214 in the storage bins 204-208, respectively. In one exemplary embodiment and for the sake of illustration, each of the indexes 210-214 may include a total 1000 lines (see FIG. 4 webpage 70 and index 90), such that each recurring index portion 152 of indexes 210-214 may take up, for example 600 lines, and each recurring index portion 156 appearing in the indexes 210-214 may take up 200 lines. Consequently, each of the unique lines 216, 218, and 220 of indexes 210-214, respectively, take up 200 lines.

Thus, in a first instance where recurring compressed portion 152 may be stored, as may happen when abbreviated index 210 is stored initially, the amount of storage space occupied by the portion 152 in bin 204 may equal to 16×600=9600 bytes, as illustrated by storage space box 222 belonging to bin 204. Similarly, the compressed recurring portion 156 of index 210 may occupy 16×200=3200 bytes, as shown by box 224 of bin 204, and the unique line portion of index 210 may similarly occupy 16×200=3200, as shown by storage space box 226 of bin 204. In this manner, the bin 204 of storage device 204 occupies a total 16000 bytes when storing the index 210.

The above techniques can further be applied to store abbreviated indexes 212 and 214, however, in so doing, a further compression can be achieved when compressing portions 152 and 156 included in those indexes. Hence, because the recurring index portions 152 and 156 were already stored as part of index 210, and because those portions are bound to be identically found in other indexes such as those associated with other web sessions, a further compression of those portions can be achieved. Thus, when storing or retrieving recurring portions 152 and 156 as part of index 212, the CCS 20 can recognize such blocks as recurring and common to many web sessions, such that the CCS 20 can call upon or point to the already stored or retrieved portion 152 and 156, represented by blocks 222 and 226 (stored in bins 204 and 208, respectively), as represented by the dash lines extending between storage block 222 and storage block 228, and between blocks 230 and 226, where such compressed 16 byte pointer data is stored.

Alternatively, a further compression or decompression of the recurring index portion 152 of index 212 can be achieved by utilizing, once more, the above hash function (or its inverse) for reducing or enlarging the number of bytes of the recurring portions (e.g., 152 and 156) included in other indexes, such as the indexes 212 and 214, so that the recurring index portions 152 and 156 can each be represented by only by 16 bytes instead of 9600 bytes and 3200 bytes, respectively.

With the foregoing in mind, the storage of the abbreviated may proceed such that index portions 152 and 156 in each of the indexes 212 and 214 may each be formed of 16 bytes. Hence, for example, as applied to index 212, storage space blocks 228 and 230 of bin 206 may each occupy a total of 16 bytes while the unique lines 218 of index 212 remain at 16×200=3200 bytes, as represented by block 232 of bin 206. Thus, in storing the index 212, storage bin 206 occupies a total of 3232 bytes, thereby indicating a significant reduction in storage space relative to the amount of data represented by bin 204. Hence, while the index portions 210-214 may be associated with different web sessions associated with various users (e.g., loginJuserX of page 30), recurring data in such different web sessions may be common enough to form certain recurring patterns in stored web data, as exemplified by index portions 152 and 156 of indexes 21-214. In accordance with the present technique such recurring data can be exploited to further compress data, leading to significant reduction in storage space.

Similarly, index 214 can be saved in bin 208 of storage device 202. As illustrated by storage space blocks 234 and 236 of bin 208, each of the aforementioned blocks may occupy 16 bytes (e.g., formed out of recurring index portions 152 and 156), while the block 238, including unique lines 220, may form 16×200=3200 bytes. Hence, the bin 208, too, occupies a total of 3232 bytes, again, indicating a significant reduction of storage space relative to storage bin 204.

Those skilled in the art will appreciate that the storage device 202 may be used to retrieve (as illustrated by double arrows 240 of FIG. 6) data already stored and compressed therein. Accordingly, without loss of generality, the above storage techniques can also be applied to for retrieving and decompressing the data, such as the indexes 210-214, as well as the web sessions those represent, as provided, for example, by page 70, index 90, and webpages 30 and 50, all illustrated above in FIGS. 1-6. Furthermore, by utilizing the above mappings (or their inverse), in respective data compression or decompression operations, data obtained directly from web sessions can be stored or retrieved by applying such mappings without first having to read the data so as to obtain a key, cryptic code and the like. It should be understood that the above numerical values used for the number of lines, as implemented in the above compression technique, as well as the byte values resulting from the use of a suitable hash functions are not exhaustive and are merely exemplary for illustrating the present technique. Accordingly, the present compression technique may compress any number of lines along with a choice of any suitable hash function giving rise to varying byte hash values, as may be desired and chosen by one having ordinary skill.

Thus, the data stored in bin 204 of storage device 202 can be retrieved and decompressed using an inverse mapping, such as one derived from the hash function used to achieve index 90 of FIG. 4. In so doing, lines of webpage 70 can be achieved from which original web session data can be reconstructed and provided to the user upon request. In accordance with the present technique, further compressed data, as provided by, for example the storage blocks 228, 230, 234, and 236 of storage bins 206 and 208, respectively, can be initially decompressed utilizing, again, an inverse mapping, such as one derived by the above mentioned hash function or other similar functions used in data compression/decompression. Hence, for example, in decompressing the block 228 of the bin 206, block 222 of bin 204 forming the decompressed version of recurring index portion 152, can be called upon to reform the recurring index portion 152 of index 212. By further example, in decompressing block 230, block 226 of bin 204 forming the decompressed version of recurring index portion 156, can be called upon to reform the index portion 156 of index 212.

It should be borne in mind that in both the decompression and compression phases, the present technique may utilizes various statistical and probabilistic methods, such as Bayesian probability, for recognizing recurring patterns formed by the disclosed abbreviated indexes, i.e., indexes 210-214. In other words, contents and data structure formed by the abbreviated indexes and their recurring portions, such as index portions 152 and 156, may repeat enough times so that statistical averages could be formed to typify such index content as being associated with a particular abbreviated index (e.g., indexes 150, 170, and 210-214), and ultimately associating such data with a specific webpage or web session, as provided by webpage 30 or 50 (see FIGS. 2 and 3). Thus, by using the above pattern recognition technique, it may be sufficient to recognize only a portion of the abbreviated index, i.e., portions 152 and 156, in order to reconstruct and, thus, decompress the entire abbreviated index without decompressing every index line or every page line (e.g., page 70) for ultimately retrieving the web sessions and webpages, such as those provided over the network 10 (see FIG. 1).

By way of example, should a portion of data be retrieved from storage device 202, whereby that portion exhibits traits statistically similar to a structure shared by a recurring pattern of index portion, i.e., portion 152, and if that index portion is included only in a certain type of web session, i.e., webpage 30, then such a pattern could be immediately associated with such a web session whose make up is already known and recognized based on the statistical averages obtained by observing many other sessions associated having a similar make up.

Furthermore should recurring contents of the webpages change overtime, such that their abbreviated index make up and/or structure statistically deviates from previously acquired pages, the above methods can be utilized repeatedly to recognize and learn through statistical averages and/or through Bayesian probability the new index makeup and structure of the altered webpage. Thus, once such averages become statistically significant, the altered webpage can be associated with a different abbreviated index, as provided by index 170 and its recurring portions 172 and 176 of FIG. 5.

Figure 7:
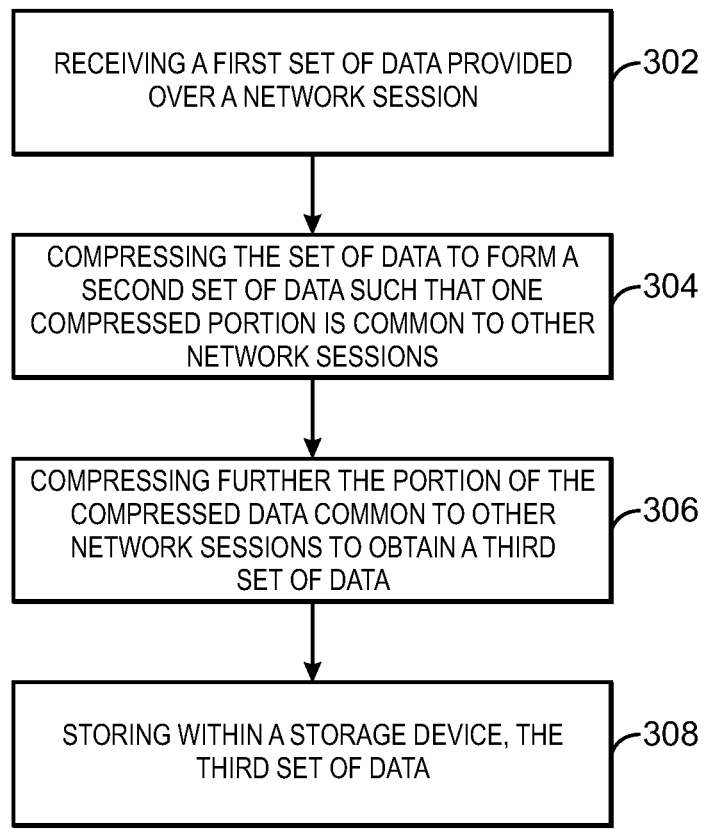
FIG. 7 is a block diagram of a process flow in accordance with one embodiment of the present technique.

FIG. 7 is a block diagram 300 of a process flow in accordance with one embodiment of the present technique. Accordingly, the process flow 300 describes a method for storing data utilizing compression techniques, as discussed above with reference to FIGS. 1-6. Hence, the method begins at block 302 in which a set of data (e.g., webpages 30, 50, page 70) provided over a network session is received through a data a processor, data server and/or other devices such as those described in FIG. 1. Further, at block 304 the of the process flow 300 the received data is compressed, as achieved by a processing device, to form a second set of data (e.g. indexes 150 and 170). In so doing, the second set of data forms a number of bytes smaller than the original set of data such that the second set of data occupies a storage space (e.g., blocks 222 and 226) smaller than the space occupied by the originally obtained data set. In accordance with the present technique, the second set of compressed data includes a portion of compressed data common to other network sessions (e.g., portions 152 and 156), as well as, a data portion unique to the network representing some of the originally obtained first data.

Further, at block 306 of the process flow 300, the portion of compressed data common to the other networks is further compressed to obtain a third set of data (e.g., blocks 228-232), such that the third set of data (also including the portion of the data unique to the other network session) has a number bytes smaller than the second set of data. Consequently, the third set of compressed data occupies a storage space smaller than that occupied by the second set of data. Finally, at block 308 of process flow 300, the third set of data is stored in a storage device. It should be borne in mind that block 306 may also include a process whereby the present technique employs pattern recognition algorithms so as to identify recurring patterns in the compressed data common to other network sessions. In so doing, the present technique utilizes such recognition to determine in advance which data is recurring so that it may be stored at much lower rates than data unique to the network sessions. In other words, by knowing in advance which data is recurring and representative of commonly used data in all web sessions, may not necessitate saving a copy of each commonly used data with each web sessions but instead, for example, a single copy of such data may be stored per many web sessions using such commonly appearing data. It should further be born in mind that once patterns of compressed data common to other network start deviating from previously acquired similar web sessions (as may happen when fields of the web pages are altered), the present technique can utilize various learning algorithms, manly based on known statistical methods (e.g., averaging distributions, Bayesian probability), for relearning new patterns of recurring data. Thereafter, the present technique can utilize process flow 300 again for compressing the newly acquired. data.

Figure 8:
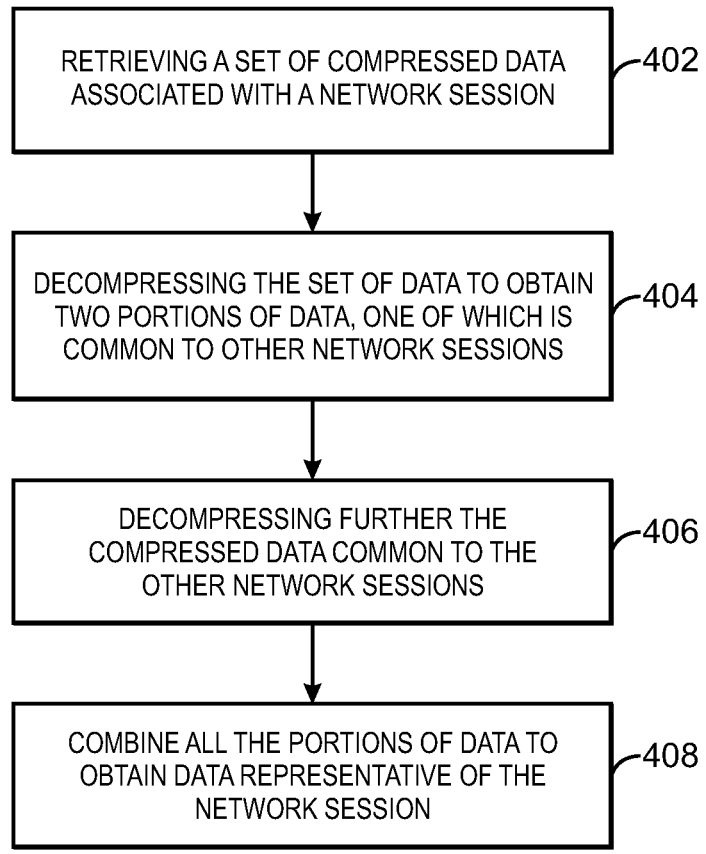
FIG. 8 is a block diagram of another process flow in accordance with one embodiment of the present technique.

FIG. 8 is a block diagram 400 of another process flow in accordance with one embodiment of the present technique. Accordingly, the process flow provides a method for decompressing data stored in a storage device retrieving form a storage device, as described above with reference to FIGS. 1-6. Accordingly, the process flow 400 begins at block 402, where a set of compressed data (e.g., blocks 228, 230 and 232 of bin 206) is retrieved from a storage device. In accordance with the present technique the compressed data may be associated with a network session (e.g., webpages 30, 50 and page 70) provided over a network. In one exemplary embodiment, the retrieved compressed data may be formed of compressed data portions common to other compressed data associated with other network sessions (e.g., blocks 228 and 230), while other compressed portions of the data may be associated with data unique (e.g., block 232, index lines 98, 100 or lines 218) to the web session at hand.

Further, at block 404, the retrieved data of block 402 is decompressed to obtain a first portion of compressed data (e.g., index portion 152, 212) common to other compressed data, as well as a first portion of data (e.g., lines 78 and 80 of page 70, and fields 34 of webpage 30). Accordingly, the latter compressed and decompressed include a number of bytes larger than the first and second portions originally retrieved at step 402. Further, at block 406, the first portion of compressed data obtained in block 404 is further decompressed so that it forms a second portion of data (e.g., page lines 74-78 and 82, and fields 36 and 38), i.e., actual data common to the other web sessions. Finally at step 408, the first and second portions of data are combined to obtain a set of data including the network session, such that the network session data comprises a number of bytes larger than the first portion of compressed and the first portion of data.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for storing network sessions data, the method comprising:
   receiving, with at least one processing device, a plurality of first sets of data, each provided over a given network session and all of the first sets of data corresponding to versions of at least one webpage,
   compressing, with the at least one processing device, each first set of data to form a plurality of second sets of data, wherein the second sets of data comprise a number of bytes smaller than the first sets of data, the compressing each first set of data comprising:
   parsing the at least one web page into lines;
   mapping, with a hash function, each of the lines; and
   forming an index from each of the lines, wherein the index comprises a total number of bytes smaller than the number of bytes comprising a total number of lines of the webpage;
   identifying a first portion of the compressed data of one of the second sets of data that is common to all other second sets of data and a second portion of compressed data of the one of the second sets of data that is not common to all the other second sets of data;
   compressing, with the at least one processing device, further the first portion of the compressed data common to all the second sets of data by replacing the first portion of the compressed data in the one of the second sets of data with an object indicating a location of the first portion of the compressed data in another of the second sets of data to obtain a third set of compressed data, wherein: (a) the third set of compressed data is representative of the network session from which the first set of data corresponding to the one of the second sets of data was provided, (b) the third set of data has a total number of bytes smaller than the one of the second sets of data, and (c) compressing further the first portion of the compressed data common to all the second sets of data comprises recognizing a statistical recurring pattern appearing in the common compressed data, wherein the pattern is shared by compressed data comprising the other second sets of data; and
   storing, within a persistent storage device, the third set of compressed data.

2. The method of claim 1, wherein compressing further the first portion of the compressed data common to all the second sets of data comprises utilizing a hash function to compress the common compressed data, so that it forms at least one index line whose total number of bytes is equivalent to a number of bytes comprising an index line achieved by compressing the second portion of compressed data of the one of the second sets of data that is not common to all the other second sets of data.

3. The method of claim 1, wherein the object comprises a pointer.

4. The method of claim 1, further comprising:
retrieving, with the at least one processing device, from the persistent storage device, the third set of compressed data;
decompressing with the at least one processing device, the third set of compressed data to obtain the portion of the compressed data common to other network sessions comprised within the second set of data;
decompressing, with the at least one processing device, further the second set of data to obtain the first set of data.

5. A method for retrieving data, comprising:
retrieving, with at least one processing device, from a persistent storage device, a set of compressed data, wherein the compressed data is associated with a given network session;
decompressing, with the at least one processing device, the set of compressed data to obtain a first portion of compressed data and a first portion of data, wherein the first portion of compressed data comprises data that is common to other network sessions, other than the given network session, and wherein a total number of bytes comprising the first portion of compressed data and the second portion of data is larger than a number of bytes comprising the set of retrieved compressed data;
decompressing, with the at least one processing device, further the first portion of compressed data common to the other network sessions to obtain a second portion of data; and
combining the first and second portions of data to obtain data comprising the network session, wherein the data comprising the given network session comprises a number of bytes larger than the first portion of compressed data and the first portion of data.

6. The method of claim 5, wherein the given network session comprises at least one webpage, and wherein the other network sessions comprise webpages other than the webpage.

7. The method of claim 5, wherein the compressed set of data comprises index lines obtained from a compression of data utilizing a hash function.

8. The method of claim 7, wherein decompressing the set of compressed data comprises utilizing an inverse of the hash function to obtain from each of the index lines page lines comprising the given network session.

9. The method of claim 5, wherein decompressing further the portion of the compressed data common to other network sessions comprises recognizing a statistical recurring pattern appearing in the compressed data common to other network sessions.

10. The method of claim 5, wherein decompressing further the portion of the compressed data common to other network sessions comprises pointing to a file, wherein the file is associated with network sessions other than the given network session.

11. A system for storing network sessions data comprising a processing device configured to:
receive a plurality of first sets of data, each provided over a given network session and all of the first sets of data corresponding to versions of at least one webpage;
each first set of data, to form a plurality of second sets of data, wherein the second sets of data comprises a number of bytes smaller than the first sets of data, the compressing each first set of data comprising:
parsing the at least one web page into lines;
mapping with a hash function, each of the lines; and
forming an index from each of the lines, wherein the index comprises a total number of bytes smaller than the number of bytes comprising a total number of lines of the webpage;
identify a first portion of the compressed data of one of the second sets of data that is common to all other second sets of data and a second portion of compressed data of the one of the second sets of data that is not common to all the other second sets of data;
compress further the first portion of the compressed data common to all de second sets of data by replacing the first portion of the compressed data in the one of the second sets of data with an object indicating a location of the first portion of the compressed data in another of the second sets of data to obtain a third set of compressed data, wherein: (a) the third set of compressed data is representative of the network session from which the first set of data corresponding to the one of the second sets of data was provided, (b) the third set of compressed data has a total number of bytes smaller than the one of the second sets of data, and (c) compressing further the first portion of the compressed data common to all the second sets of data comprises recognizing a statistical recurring pattern appearing in the common compressed data, wherein the pattern is shamed by compressed data comprising the other second sets of data; and
store, within a persistent storage device, the third set of compressed data.

12. The system of claim 11, wherein compressing further the portion of the compressed data common to other network sessions comprises utilizing a hash function to compress the common compressed data, so that it forms at least one index line whose total number of bytes is equivalent to a number of bytes comprising an index line achieved by compressing data included in the set of data that is not common to the other network sessions.

13. The system of claim 11, wherein compressing further the portion of the compressed data common to other network sessions comprises pointing to a file, wherein the file is associated with network sessions other than the given network session.

14. The system of claim 11, wherein the processing device is further configured to:
retrieve from the persistent storage device, the third set of compressed data, wherein the third set of compressed data is associated with the given network session;
decompress the third set of compressed data to obtain the portion of the compressed data common to other network sessions comprised within the second set of data;
decompress further the second set of data to obtain the first set of data.

15. A tangible, non-transitory, machine readable medium comprising code executable to perform the tasks of:
receiving, with at least one processing device, a plurality of first set of data, each provided over a given network session and all of the first sets of data corresponding to versions of at least one webpage;
compressing, with the at least one processing device, each first set of data to form a plurality of second set of data, wherein the second sets of data comprise a number of bytes smaller than the first sets of data, the compressing each first set of data comprising:
parsing the at least one web page into lines;
mapping, with a hash function, each of the lines; and
forming an index from each of the lines, wherein the index comprises a total number of bytes smaller than the number of bytes comprising a total number of lines of the webpage;
identifying, with the at least one processing device, a first portion of the compressed data of one of the second sets of data that is common to all other second sets of data and a second portion of compressed data of the one of the second sets of data that is not common to all the other second sets of data;
compressing, with the at least one processing device, further the portion of the compressed data common to all the second sets of data by replacing the first portion of the compressed data in the one of the second sets of data with an object indicating a location of the first portion of the compressed data in another of the second sets of data to obtain a third set of compressed data, wherein: (a) the third set of compressed data is representative of the network session from which the first set of data corresponding to the one of the second sets of data was provided, (b) the third set of compressed data has a total number of bytes smaller than the one of the second sets of data, and (c) compressing further the first portion of the compressed data common to all the second sets of data comprises recognizing a statistical recurring pattern appearing in the common compressed data, wherein the pattern is shared by compressed data comprising the other second sets of data; and
storing, within a persistent storage device, the third set of compressed data.

16. A tangible, non-transitory, machine readable medium comprising code
executable to perform the tasks of:
retrieving, with at least one processing device, from a persistent storage device a set of compressed data, wherein the compressed data is representative of a given network session;
decompressing with the at least one processing device, the set of compressed data to obtain a first portion of compressed data and a first portion of data, wherein a total number of bytes comprising the first portion of compressed data and second portion of data is larger than a number of bytes comprising the set of compressed data; and wherein the first portion of compressed data comprises data that is common to other network secessions, other than the given network session;
decompressing, with the at least one processing device, further the compressed data common to the other network sessions to obtain a second portion of data; and
combining the first and second portions of data to obtain data comprising the network session, where the data comprising the given network session comprises a number of bits larger than the data representative of the network session.

\* \* \* \* \*